US010355198B2

(12) United States Patent
Liao et al.

(10) Patent No.: US 10,355,198 B2
(45) Date of Patent: Jul. 16, 2019

(54) MEMORY DEVICE AND FABRICATION METHOD THEREOF

(71) Applicant: TAIWAN SEMICONDUCTOR MANUFACTURING CO., LTD., Hsinchu (TW)

(72) Inventors: Wei-Hao Liao, Taichung (TW); Chih-Wei Lu, Hsinchu (TW); Hsi-Wen Tien, Hsinchu County (TW); Pin-Ren Dai, New Taipei (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/811,405

(22) Filed: Nov. 13, 2017

(65) Prior Publication Data

US 2019/0148623 A1    May 16, 2019

(51) Int. Cl.
*H01L 43/02* (2006.01)
*H01L 27/22* (2006.01)
*H01L 43/12* (2006.01)
*H01L 43/08* (2006.01)

(52) U.S. Cl.
CPC .......... *H01L 43/02* (2013.01); *H01L 27/228* (2013.01); *H01L 43/08* (2013.01); *H01L 43/12* (2013.01)

(58) Field of Classification Search
CPC ..................................................... H01L 27/222
See application file for complete search history.

(56) References Cited

U.S. PATENT DOCUMENTS

| | | | |
|---|---|---|---|
| 2010/0003767 A1* | 1/2010 | Cho | H01L 43/08 438/3 |
| 2013/0267042 A1* | 10/2013 | Satoh | H01L 27/222 438/3 |
| 2016/0225979 A1* | 8/2016 | Hsu | H01L 43/08 |
| 2017/0170237 A1* | 6/2017 | Jung | H01L 45/1233 |

* cited by examiner

*Primary Examiner* — Jay C Chang
*Assistant Examiner* — Mikka Liu
(74) *Attorney, Agent, or Firm* — Maschoff Brennan

(57) ABSTRACT

A memory device includes an MTJ structure and a first metal residue. The MTJ structure includes a top surface having a first width, a bottom surface having a second width greater than the first width, and a stepped sidewall structure between the top surface and the bottom surface. The stepped sidewall structure includes a first sidewall, a second sidewall, and an intermediary surface connecting the first sidewall to the second sidewall. The first metal residue is in contact with the first sidewall and not in contact with the second sidewall.

20 Claims, 8 Drawing Sheets

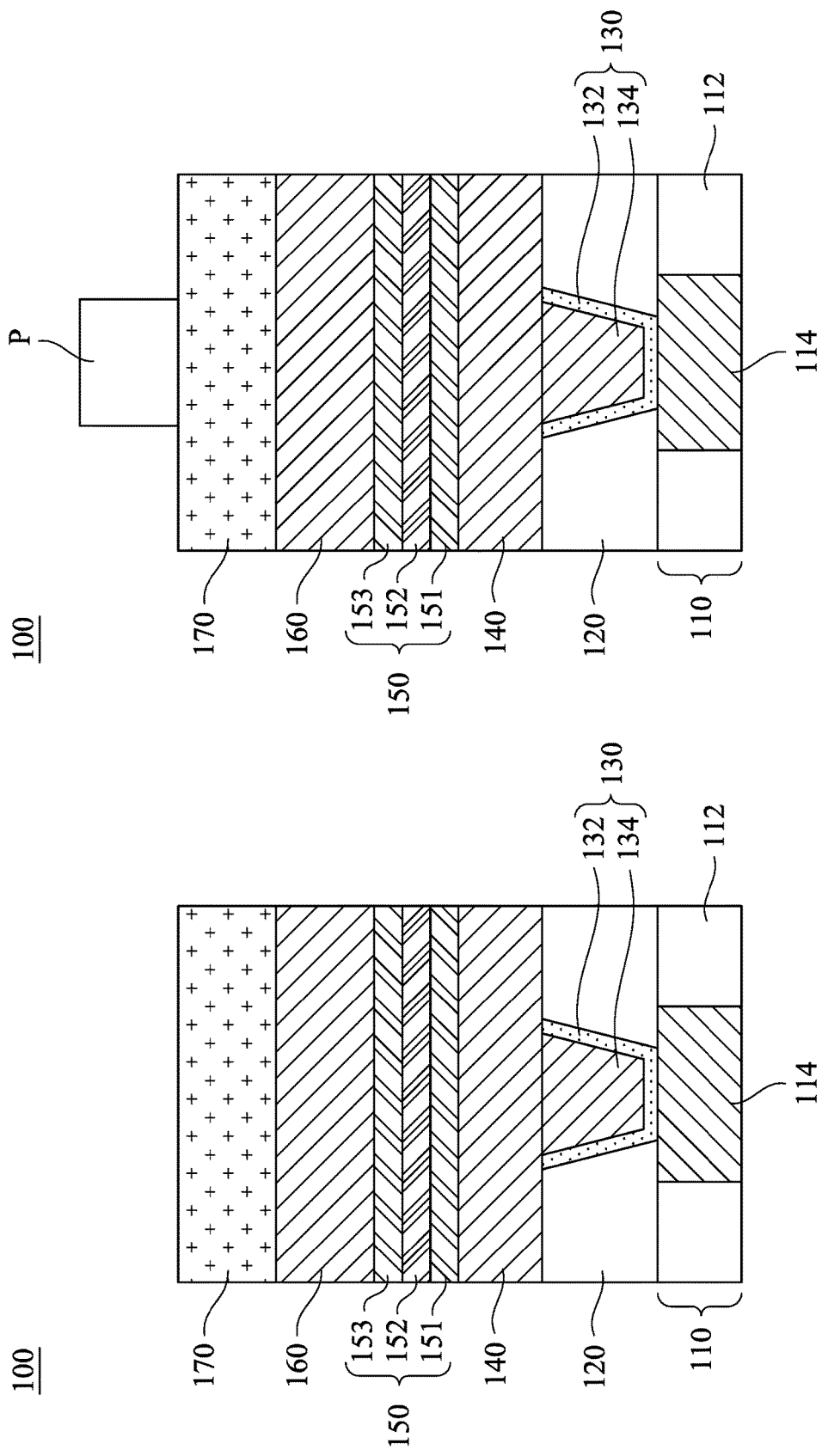

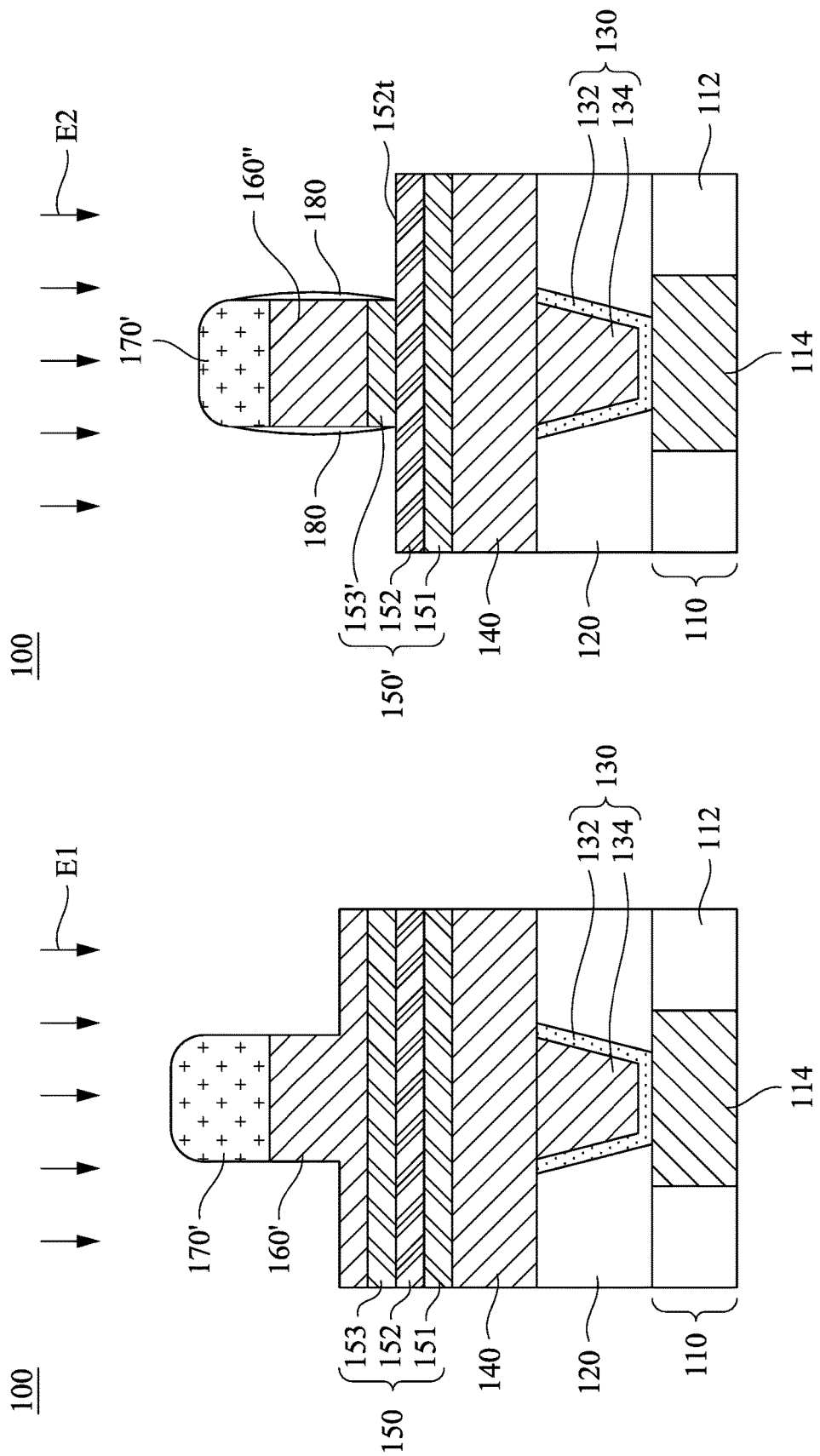

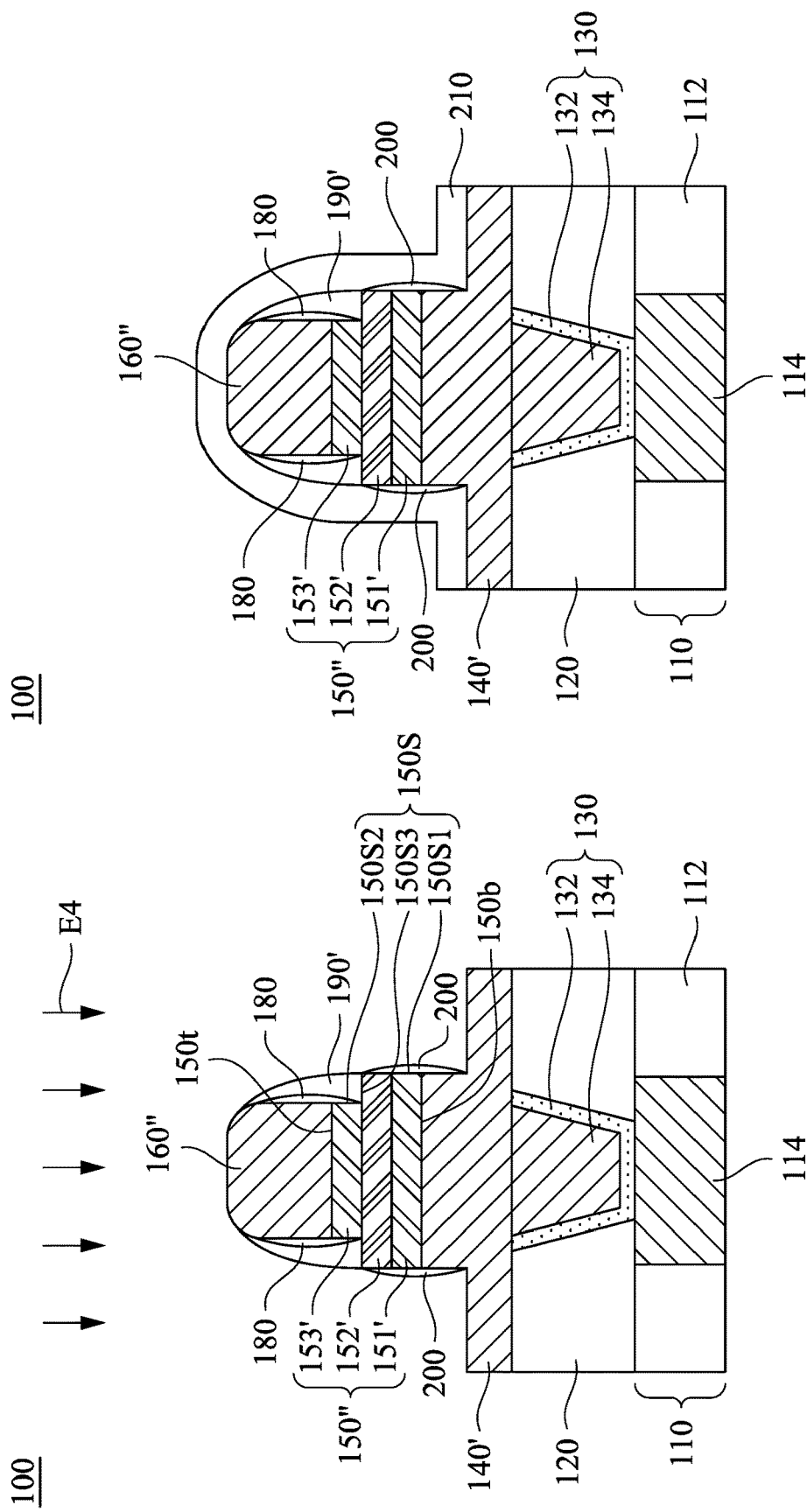

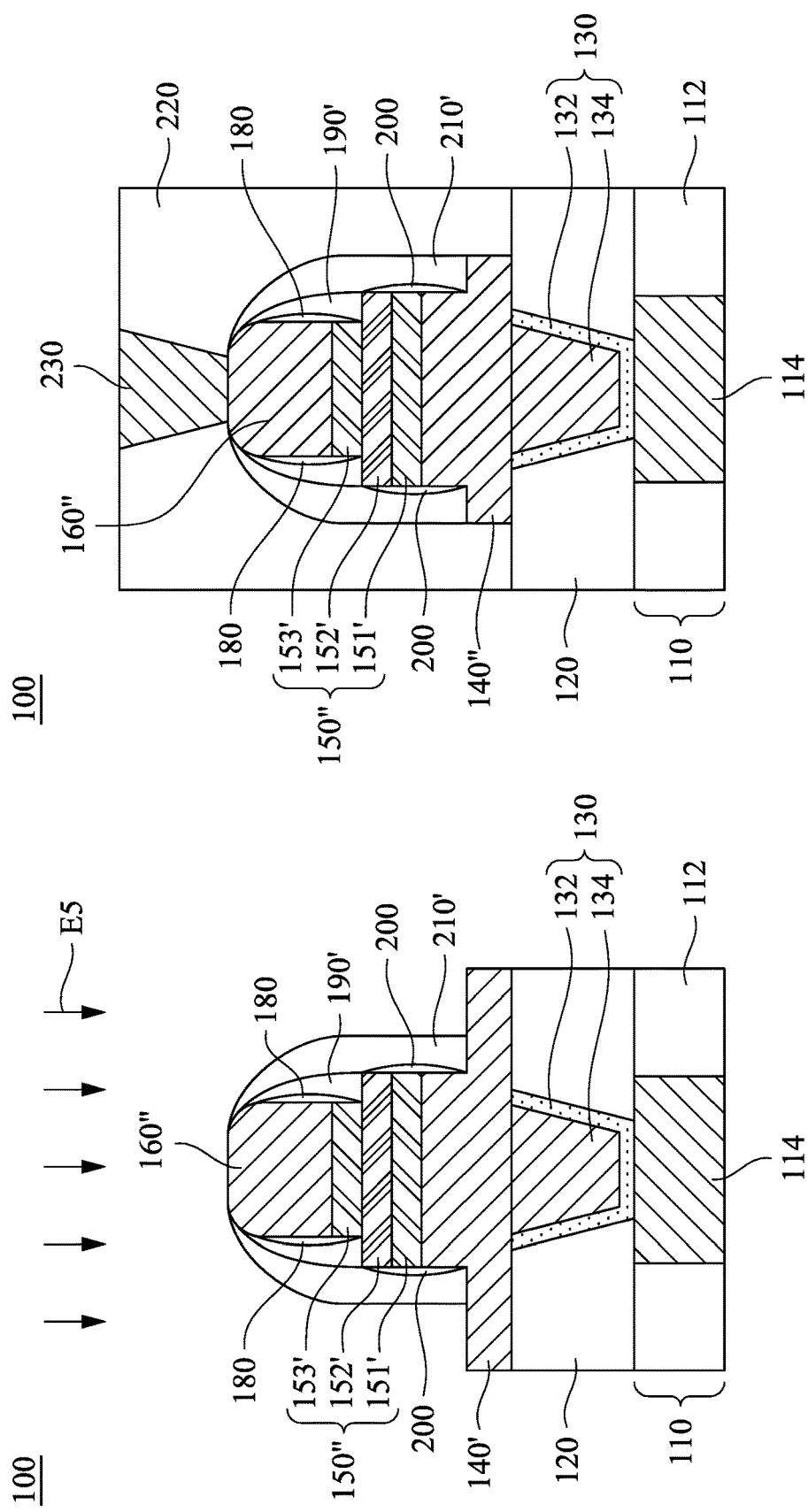

MEMORY DEVICE AND FABRICATION METHOD THEREOF

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-13 are cross-sectional views of the MRAM device at various intermediate stages of manufacture according to various embodiments of the method of FIG. 1.

DETAILED DESCRIPTION

Figure 1:
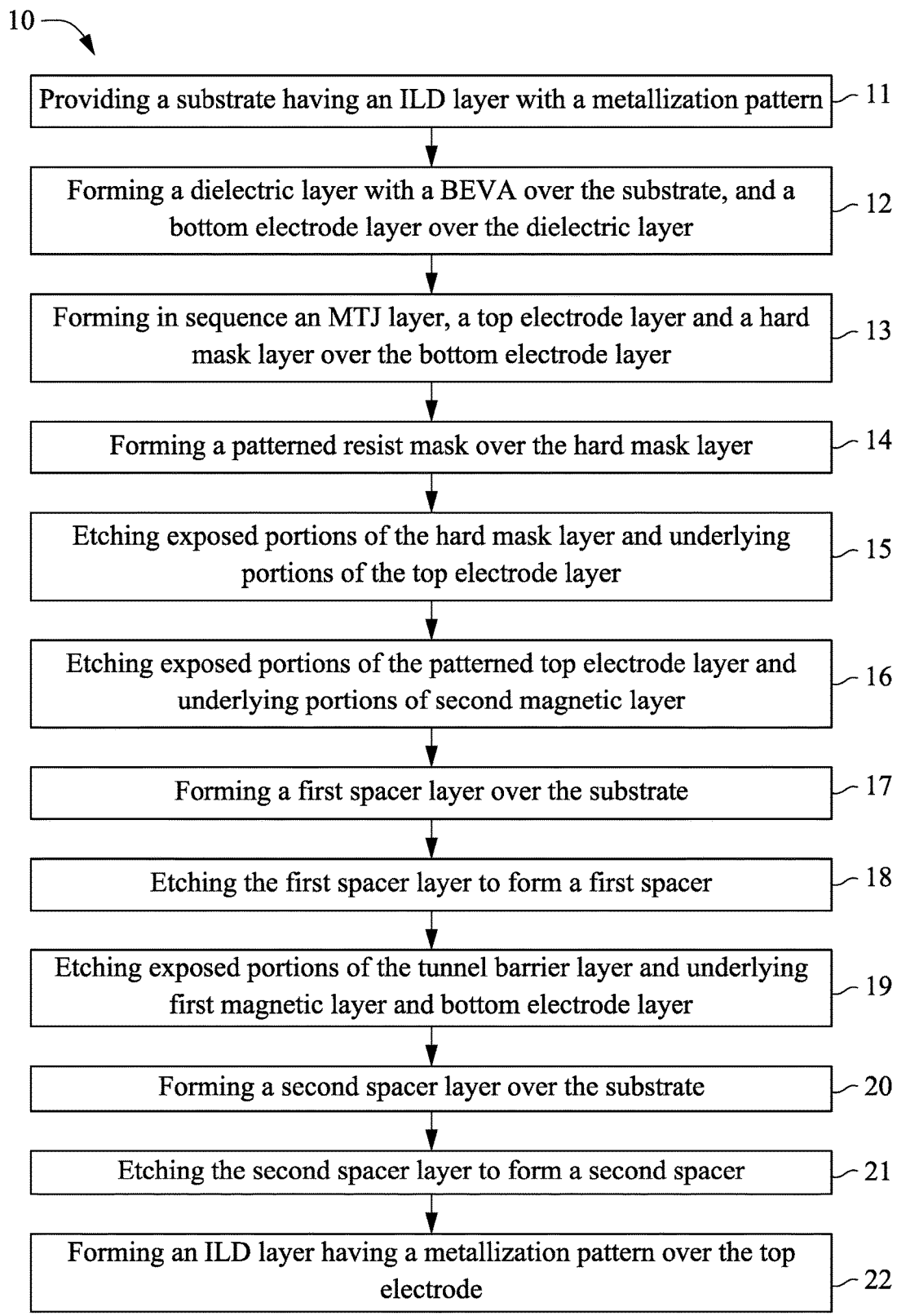
FIG. 1 is a flow chart of a method of forming a semiconductor structure having an MRAM device according to some embodiments of this disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 is a flow chart of a method 10 of forming a semiconductor structure having an MRAM device according to some embodiments of this disclosure. FIGS. 2-13 are cross-sectional views of the MRAM device 100 at various intermediate stages of manufacture according to various embodiments of the method 10 of FIG. 1. Additional processes may be performed before, during, or after the method 100 of FIG. 1. Various figures have been simplified for a better understanding of the inventive concepts of the present disclosure.

Figure 2:
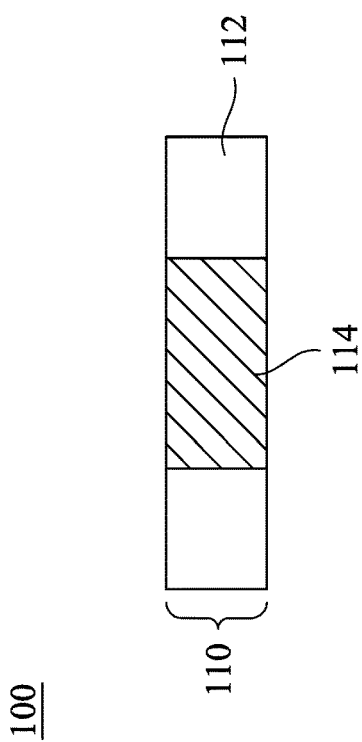

Referring now to FIG. 1, the flowchart of the method 10 begins with an operation 11. In some embodiments, a substrate having an inter-layer dielectric (ILD) layer or inter-metal dielectric (IMD) with a metallization pattern is provided. For example, FIG. 2 illustrates a wafer having a substrate 110 thereon. The substrate 110 includes an inter-layer dielectric (ILD) layer or inter-metal dielectric (IMD) layer 112 with a metallization pattern 114. The ILD layer 112 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 114 may be aluminum, aluminum alloy, copper, copper alloy, titanium, titanium nitride, tantalum, tantalum nitride, tungsten, the like, and/or combinations thereof. Formation of the metallization pattern 114 and the ILD layer 112 may be a dual-damascene process and/or a single-damascene process. The substrate 110 may also include active and passive devices, for example, underlying the ILD layer 112. These further components are omitted from the figures for clarity.

Referring back to FIG. 1, the flowchart of the method 10 continues with an operation 12. In some embodiments, a dielectric layer having a bottom electrode via (BEVA) therein is formed over the substrate, and a bottom electrode (BE) layer is formed over the dielectric layer.

Figure 3:
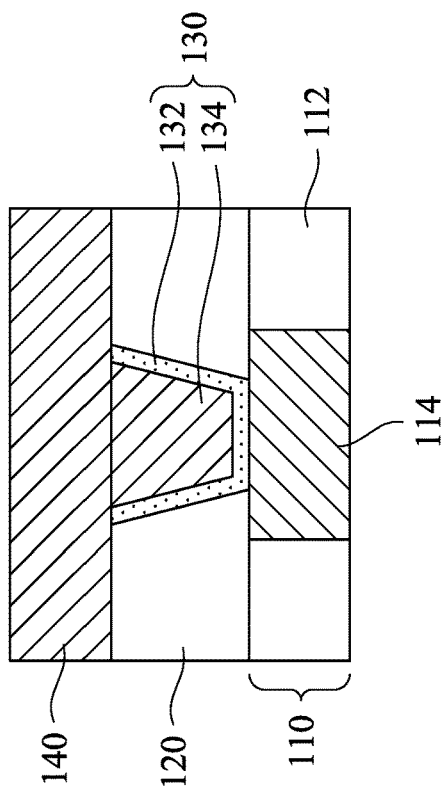

Reference is then made to FIG. 3, which is a cross-sectional view of the MRAM device 100 after performing the operation 102. A dielectric layer 120 is formed over the substrate 110. The dielectric layer 120 in some embodiments is silicon carbide (SiC), silicon oxynitride (SiON), silicon nitride (SiN), silicon dioxide, the like, and/or combinations thereof. The dielectric layer 120 may be a single-layered structure or a multi-layered structure. The dielectric layer 120 may be formed by acceptable deposition techniques, such as chemical vapor deposition (CVD), atomic layer deposition (ALD), physical vapor deposition (PVD), the like, and/or a combination thereof.

A bottom electrode via (BEVA) 130 is then formed within the dielectric layer 120. In some embodiments, the BEVA 130 is a multi-layered structure and includes, for example, a diffusion barrier layer 132 and a filling metal 134 filling a recess in the diffusion barrier layer 132. An exemplary formation method of the BEVA 130 includes etching an opening in the dielectric layer 120, forming in sequence the diffusion barrier layer 132 and the filling metal 134 into the opening in the dielectric layer 120, and performing a planarization process, such as a chemical-mechanical polish (CMP) process, to remove excess materials of the filling metal 134 and of the diffusion barrier layer 132 outside the opening in the dielectric layer 120. The remaining diffusion barrier layer 132 and the remaining filling metal 134 in the opening in the dielectric layer 120 can serve as the BEVA 130. In some embodiments, the BEVA 130 is electrically connected to an underlying electrical component, such as a transistor, through the metallization pattern 114.

In some embodiments, the diffusion barrier layer 132 is a titanium nitride (TiN) layer or a tantalum nitride (TaN) layer, which can act as a suitable barrier to prevent metal diffusion. Formation of the diffusion barrier layer 132 may be exemplarily performed using CVD, PVD, ALD, the like, and/or a combination thereof. In some embodiments, the filling metal 134 is titanium (Ti), tantalum (Ta), platinum (Pt), ruthenium (Ru), tungsten (W), aluminum (Al), copper (Cu), the like, and/or combinations thereof. Formation of the filling metal 134 may be exemplarily performed using CVD, PVD, ALD, the like, and/or a combination thereof.

A blanket bottom electrode layer 140 is then formed over the BEVA 130 and over the dielectric layer 120, so that the bottom electrode layer 140 extends along top surfaces of the BEVA 130 and of the dielectric layer 120. The bottom electrode layer 140 can be a single-layered structure or a multi-layered structure. The bottom electrode layer 140 includes a material the same as the filling metal 134 in some embodiments. In some other embodiments, the bottom electrode layer 140 includes a material different from the filling metal 134. In some embodiments, the bottom electrode layer 140 is titanium (Ti), tantalum (Ta), platinum (Pt), ruthenium (Ru), tungsten (W), aluminum (Al), copper (Cu), the like, and/or a combination thereof. Formation of the bottom electrode layer 140 may be exemplarily performed using CVD, PVD, ALD, the like, and/or a combination thereof.

Referring back to FIG. 1, the flowchart of the method 10 continues with an operation 13. In some embodiments, a magnetic tunnel junction (MTJ) layer, a top electrode layer and a hard mask layer are formed in sequence over the bottom electrode layer.

Reference is then made to FIG. 4, which is a cross-sectional view of the MRAM device 100 after performing the operation 13. A first magnetic layer 151, a tunnel barrier layer 152 and a second magnetic layer 153 are formed in sequence over the bottom electrode layer 140. The first and second magnetic layers 151, 153 and the tunnel barrier layer 152 therebetween collectively form a magnetic tunnel junction (MTJ) and are thus in combination referred to as an MTJ layer 150.

In some embodiments, the first magnetic layer 151 includes an anti-ferromagnetic material (AFM) layer over the bottom electrode layer 140 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), or iron manganese (FeMn). An exemplary formation method of the AFM layer includes sputtering, PVD, ALD or the like.

The ferromagnetic pinned layer in the first magnetic layer 151 forms a permanent magnet and exhibits strong interactions with magnets. A direction of a magnetic moment of the ferromagnetic pinned layer can be pinned by an anti-ferromagnetic material (AFM) layer and is not changed during operation of a resulting MTJ stack fabricated from the MTJ layer 150. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD or ALD. In some embodiments, the ferromagnetic pinned layer includes a multilayer structure.

The tunnel barrier layer 152 is formed over the first magnetic layer 151. The tunnel barrier layer 152 can also be referred to as a tunneling layer, which is thin enough that electrons are able to tunnel through the tunnel barrier layer when a biasing voltage is applied to a resulting MTJ stack fabricated from the MTJ layer 150. In certain embodiments, the tunnel barrier layer 152 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer 152 includes sputtering, PVD, ALD or the like.

The second magnetic layer 153 is formed over the tunnel barrier layer 152. The second magnetic layer 153 is a ferromagnetic free layer in some embodiments. A direction of a magnetic moment of the second magnetic layer 153 is not pinned because there is no anti-ferromagnetic material in the second magnetic layer 153. Therefore, the magnetic orientation of this layer is adjustable, thus the layer is referred to as a free layer. In some embodiments, the direction of the magnetic moment of the second magnetic layer 153 is free to rotate parallel or anti-parallel to the pinned direction of the magnetic moment of the ferromagnetic pinned layer in the first magnetic layer 151. The second magnetic layer 153 may include a ferromagnetic material similar to the material in the ferromagnetic pinned layer in the first magnetic layer 151. Since the second magnetic layer 153 has no anti-ferromagnetic material while the first magnetic layer 151 has an anti-ferromagnetic material therein, the first and second magnetic layers 151 and 153 have different materials. In certain embodiments, the second magnetic layer 153 includes cobalt, nickel, iron or boron. An exemplary formation method of the second magnetic layer 153 includes sputtering, PVD, ALD or the like.

A top electrode layer 160 is formed over the MTJ layer 150. The top electrode layer 160 includes a conductive material. In some embodiments, the top electrode layer 160 is similar to the bottom electrode layer 140 in terms of composition. In some embodiments, the top electrode layer 160 comprises titanium (Ti), tantalum (Ta), platinum (Pt), ruthenium (Ru), tungsten (W), aluminum (Al), copper (Cu), the like or combinations thereof. An exemplary formation method of the top electrode layer 160 includes sputtering, PVD, ALD or the like.

A hard mask layer 170 is formed over the top electrode layer 160. In some embodiments, the hard mask layer 170 is formed from a dielectric material. For example, the hard mask layer 170 may be silicon carbide (SiC), silicon oxynitride (SiON), silicon nitride (SiN), silicon dioxide ($SiO_2$), the like, and/or combinations thereof. The hard mask layer 170 may be formed by acceptable deposition techniques, such as CVD, ALD, PVD, the like, and/or combinations thereof.

Referring back to FIG. 1, the flowchart of the method 10 continues with an operation 14. In some embodiments, a patterned resist mask is formed over the hard mask layer.

Reference is then made to FIG. 5, which is a cross-sectional view of the MRAM device 100 after performing the operation 14. A resist layer is formed over the hard mask layer 170 and then patterned into a patterned resist mask P using a suitable photolithography process, such that portions of the hard mask layer 170 are exposed by the patterned resist mask P. In some embodiments, the patterned resist mask P is a photoresist. In some embodiments, the patterned resist mask P is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Referring back to FIG. 1, the flowchart of the method 10 continues with an operation 15. In some embodiments, exposed portions of the hard mask layer and underlying portions of the top electrode layer are etched.

Reference is then made to FIG. 6, which is a cross-sectional view of the MRAM device 100 after performing the operation 15. An etching process E1 is performed to remove portions of the hard mask layer 170 and underlying top electrode layer 160 not protected by the patterned resist mask P. The hard mask layer 170 and underlying top electrode layer 160 may be etched using acceptable etching techniques, such as by using an anisotropic etching process. After removing portions of the hard mask layer 170 and underlying top electrode layer 160 disposed beyond the patterned resist mask P, a top electrode layer 160' having a hard mask cover 170' remain as shown in FIG. 6. In some embodiments, a portion of the mask layer 170 is consumed during the etching process and a remaining patterned mask layer 170 is left as the hard mask cover 170' for the following processes. Due to the consuming, the hard mask cover 170' after the etching process E1 is thinner than the hard mask layer 170 before the etching process E1. The patterned resist mask P is removed using, for example, an ash process, after the etching process E1.

The etching process E1 stops before reaching the MTJ layer 150. For example, the etching process E1 does not etch through the top electrode layer 160, and hence the second magnetic layer 153 remains covered by the top electrode layer 160'. The stopping of the etching process E1 can be controlled by the etching duration time, as examples. As illustrated in FIG. 6, after the etching process E1, a portion of the top electrode layer 160' is covered by the hard mask cover 170', and another portion of the top electrode layer 160' is exposed by the hard mask cover 170'.

Referring back to FIG. 1, the flowchart of the method 10 continues with an operation 16. In some embodiments, exposed portions of the patterned top electrode layer and underlying portions of second magnetic layer are etched.

Reference is then made to FIG. 7, which is a cross-sectional view of the MRAM device 100 after performing the operation 16. An etching process E2 is performed to remove exposed portions of the top electrode layer 160' and underlying second magnetic layer 153 not protected by the hard mask cover 170'. The top electrode layer 160' and underlying second magnetic layer 153 may be etched using acceptable etching techniques, such as by using an anisotropic etching process. After removing portions of the top electrode layer 160' and underlying second magnetic layer 153 disposed beyond the hard mask cover 170', a second magnetic layer 153' and an overlying top electrode 160" remain as shown in FIG. 7. In some embodiments, a portion of the hard mask cover 170' is consumed during the etching process and a remaining hard mask cover 170' is left for the following processes. Due to the consuming, the hard mask cover 170' after the etching process E2 is thinner than the hard mask cover 170' before the etching process E2.

The tunnel barrier layer 152 and the overlying second magnetic layer 153 have different etch resistance properties. In some embodiments, the tunnel barrier layer 152 is made of a material (e.g. MgO) which has higher etch resistance to an etchant used in the etching process E2 than that of the second magnetic layer 153. Therefore, the etching process E2 can be slowed down or even stopped by the tunnel barrier layer 152. As a result, the etching process E2 can stop at a top surface of the tunnel barrier layer 152. An exemplary etching process E2 includes a dry etch or a combination of dry etch and wet etch. The dry etching process may use fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. In the etching process E2, the hard mask cover 170' acts as an etch mask that protects underlying materials from the etching process E2.

Since the etching process E2 includes one or more dry etching operations, the second magnetic layer 153 and the top electrode layer 160' are exposed to a bombardment of ions (e.g. a plasma of reactive gases such as, for example, fluorine or chlorine). The removed materials of the second magnetic layer 153 and the top electrode layer 160' are dislodged from their exposed surfaces and are re-sputtered onto sidewalls of the second magnetic layer 153', of the top electrode 160" and of the hard mask cover 170'. These materials can be referred to as a metal residue 180 in some embodiments where the second magnetic layer 153 and the top electrode layer 160' are metals. In this way, the metal residue 180 has a material substantially the same as that of the second magnetic layer 153' and the top electrode 160".

Since the etching process E2 stops at the top surface 152t of the tunnel barrier layer 152, the metal residue 180 extending along sidewalls of the second magnetic layer 153', of the top electrode 160" and of the hard mask cover 170' terminates at the top surface 152t of the tunnel barrier layer 152. In this way, the metal residue 180 terminates prior to reaching the first magnetic layer 152. As a result, the metal residue 180 in contact with the second magnetic layer 153' is not in contact with the first magnetic layer 151', and hence the metal residue 180 cannot create an unwanted electrical connection path that electrically connects the first and second magnetic layer 151 and 153'.

Referring back to FIG. 1, the flowchart of the method 10 continues with an operation 17. In some embodiments, a first spacer layer is blanket formed over the substrate.

Figure 8:
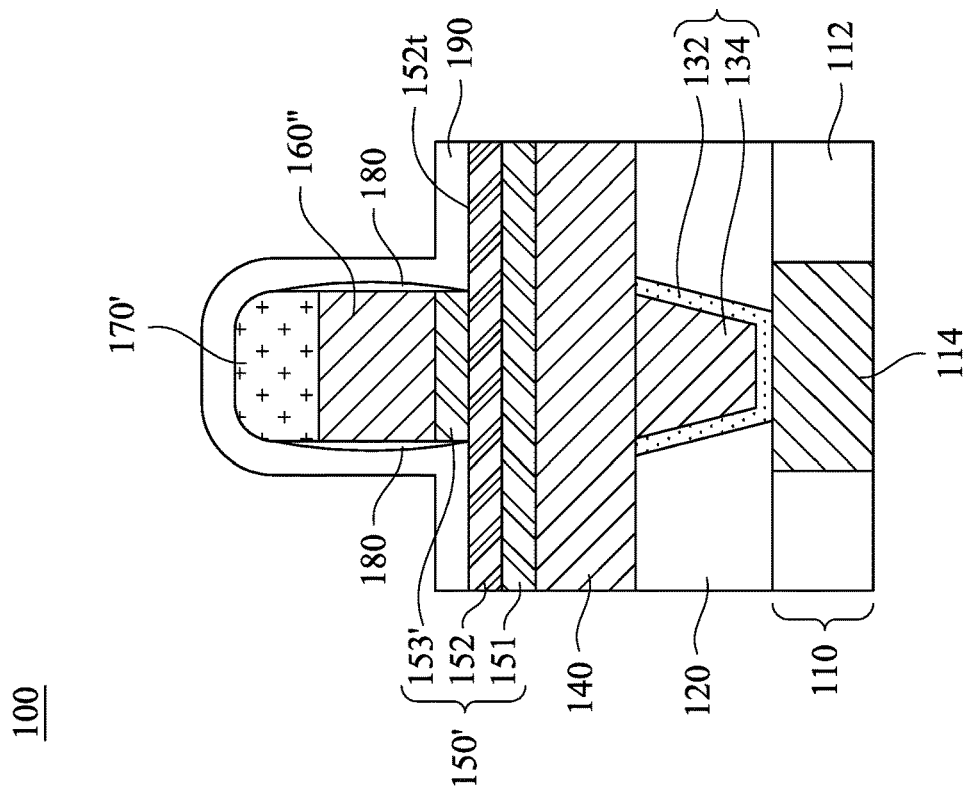

Reference is then made to FIG. 8, which is a cross-sectional view of the MRAM device 100 after performing the operation 17. A first spacer layer 190 is formed over the exposed portions of top surface 152t of the tunnel barrier layer 152, along a sidewall of the metal residue 180, and over a top surface of the hard mask cover 170'. The first spacer layer 190 in some embodiments may include SiN, but in other embodiments may include SiC, SiON, silicon oxycarbide (SiOC), the like, and/or combinations thereof. The first spacer layer 190 may be formed using CVD, PVD, ALD, the like, and/or combinations thereof.

Referring back to FIG. 1, the flowchart of the method 10 continues with an operation 18. In some embodiments, the first spacer layer is etched to form a first spacer.

Figure 9:
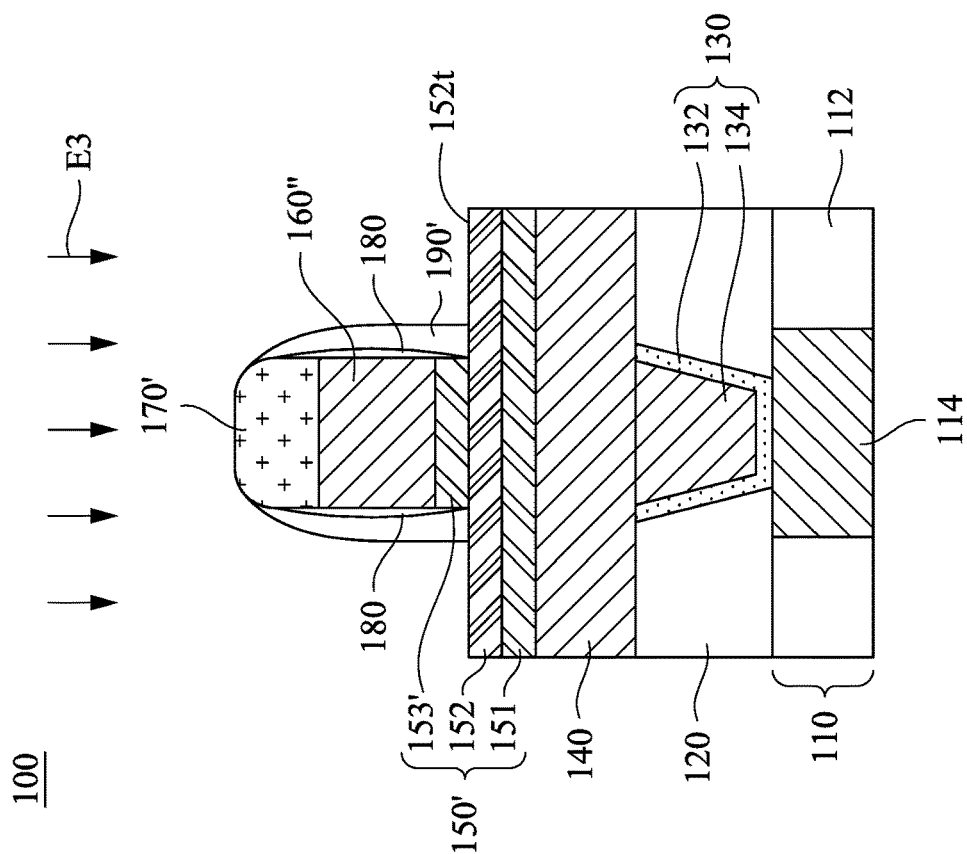

Reference is then made to FIG. 9, which is a cross-sectional view of the MRAM device 100 after performing the operation 18. An etching process E3 is performed to etch the first spacer layer 190 into at least one first spacer 190'. The etching process E3 may be an anisotropic etch back process. The first spacer 190' is in contact with a sidewall of the metal residue 180. In some embodiments, the first spacer 190' is formed around and encloses metal residue 180. In other embodiments, separate first spacers 190' may be formed at various parts along the metal residue 180 and may not fully enclose the metal residue 180. After the etching process E3, a portion of the top surface 152t of the tunnel barrier layer 152 is exposed.

Referring back to FIG. 1, the flowchart of the method 10 continues with an operation 19. In some embodiments, exposed portions of the tunnel barrier layer and underlying first magnetic layer and bottom electrode layer are etched.

Reference is then made to FIG. 10, which is a cross-sectional view of the MRAM device 100 after performing the operation 19. An etching process E4 is performed to remove exposed portions of the tunnel barrier layer 152 and underlying first magnetic layer 151 and bottom electrode layer 140 not protected by the hard mask cover 170' and the first spacer 190'. The tunnel barrier layer 152 and underlying first magnetic layer 151 and bottom electrode layer 140 may be etched using acceptable etching techniques, such as by using an anisotropic etching process. After removing portions of the tunnel barrier layer 152 and underlying first magnetic layer 151 and bottom electrode layer 140 disposed beyond the hard mask cover 170' and the spacer 180, a tunnel barrier layer 152', a first magnetic layer 151' and a bottom electrode layer 140' remain as shown in FIG. 10. The first magnetic layer 151', the tunnel barrier layer 152' and the second magnetic layer 153' are in combination referred to as an MTJ stack or structure 150". In some embodiments, the hard mask cover 170' is consumed during the etching process E4 and a top surface of the top electrode 160" is exposed.

An exemplary etching process E4 includes a dry etch or a combination of dry etch and wet etch. The dry etching process may use fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. In the etching process E4, the hard mask cover 170' and the first spacer 190' in combination act as an etch mask that protects underlying materials from the etching process E4, such that widths of the tunnel barrier layer 152' and of the first magnetic layer 151' can be determined by a combination of widths of the first spacer 190' and of the hard mask cover 170'. In some embodiments, the etching process E4 and the previously performed etching process E2 in FIG. 7 use substantially the same etchant. In other embodiments, the etching process E4 and the previously performed etching process E2 in FIG. 7 use different etchants.

Since the etching process E4 includes one or more dry etching operations, the tunnel barrier layer 152 and the first magnetic layer 151 and the bottom electrode layer 140 are exposed to a bombardment of ions (e.g. a plasma of reactive gases such as, for example, fluorine or chlorine). The removed materials of the tunnel barrier layer 152 and the first magnetic layer 151 and the bottom electrode layer 140 are dislodged from their exposed surfaces and are re-sputtered onto sidewalls of the tunnel barrier layer 152', of the first magnetic layer 151' and of the bottom electrode layer 140'. These materials include a metal residue 200 in some embodiments where the first magnetic layer 151 and the underlying bottom electrode layer 140 are metals. In this way, the metal residue 200 has a material substantially the same as that of the first magnetic layer 151' and the bottom electrode layer 140'. Since the first and second magnetic layers 151' and 153' have different materials, the metal residues 180 and 200 may have different materials in some embodiments.

The metal residue 200 extends along sidewalls of the tunnel barrier layer 152', of the first magnetic layer 151' and of the bottom electrode layer 140'. The metal residue 200 terminates prior to reaching the second magnetic layer 153' because the sidewall of the second magnetic layer 153' is covered by the first spacer 190'. As a result, the metal residue 200 in contact with the first magnetic layer 151' is not in contact with the second magnetic layer 153', and hence the metal residue 200 cannot create an unwanted electrical connection path that electrically connects the first and second magnetic layer 151' and 153'.

As illustrated in FIG. 10, the MTJ stack 150" includes a top surface 150t having a first width, a bottom surface 150b having a second width greater than the first width, and a stepped sidewall structure 150S between the top surface 150t and the bottom surface 150b. A top surface of the second magnetic layer 153' can serve as the top surface 150t of the MTJ stack 150", and a bottom surface of the first magnetic layer 151' can serve as the bottom surface 150b of the MTJ stack 150". The stepped sidewall structure 150S includes a first sidewall 150S1, a second sidewall 150S2 and an intermediary surface 150S3 connecting the first sidewall 150S1 to the second sidewall 150S2. The sidewalls of the first magnetic layer 151' and of the tunnel barrier layer 152' can in combination serve as the first sidewall 150S1 of the MTJ stack 150". The sidewall of the second magnetic layer 153' can serve as the second sidewall 150S2 of the MTJ stack 150". The top surface of the tunnel barrier layer 152' can serve as the intermediary surface 150S3 of the MTJ stack 150".

The metal residue 180 is in contact with the second sidewall 150S2 and not in contact with the first sidewall 150S1. For example, the metal residue 180 is in contact with the sidewall of the second magnetic layer 153' and not in contact with the sidewall of the first magnetic layer 151'. The metal residue 200 is in contact with the first sidewall 150S1 and not in contact with the second sidewall 150S2. For example, the metal residue 200 is in contact with the sidewall of the first magnetic layer 151' and not in contact with the sidewall of the second magnetic layer 153'. As a result, an unwanted electrical connection between the first and second magnetic layers 151' and 153' caused by metal residues generated from the MTJ etching process can be prevented.

As illustrated in FIG. 10, in some embodiments, the intermediary surface 150S3 is free from coverage of the metal residues 180 and 200, so as to prevent the unwanted electrical connection between the first and second magnetic layers 151' and 153'. For example, the intermediary surface 150S3 is in contact with the first spacer 190'. As a result, no metal residue is between the tunnel barrier layer 152' and the first spacer 190'.

Referring back to FIG. 1, the flowchart of the method 10 continues with an operation 20. In some embodiments, a second spacer layer is blanket formed over the substrate.

Reference is then made to FIG. 11, which is a cross-sectional view of the MRAM device 100 after performing the operation 20. A second spacer layer 210 is formed over the exposed portions of the bottom electrode layer 140' and around the metal residue 200 and the first spacer 190'. The second spacer layer 210 in some embodiments may include SiN, but in other embodiments may include SiC, SiON, silicon oxycarbide (SiOC), the like, and/or combinations thereof. The second spacer layer 210 may be formed using CVD, PVD, ALD, the like, and/or combinations thereof.

Referring back to FIG. 1, the flowchart of the method 10 continues with an operation 21. In some embodiments, the second spacer layer is etched to form a second spacer.

Reference is then made to FIG. 12, which is a cross-sectional view of the MRAM device 100 after performing the operation 21. An etching process E5 is performed to etch the second spacer layer 210 into at least one second spacer 210'. The etching process E5 may be an anisotropic etch back process. The second spacer 210' is in contact with a sidewall of the metal residue 200 and a sidewall of the first spacer 190'. In some embodiments, the second spacer 210' is formed around and encloses metal residue 200 and the first spacer 190'. In other embodiments, separate second spacers 210' may be formed at various parts along the metal residue 200 and the first spacer 190' and may not fully enclose the metal residue 200 and the first spacer 190'. After the etching process E5, a portion of the bottom electrode layer 140' is exposed.

Referring back to FIG. 1, the flowchart of the method 10 continues with an operation 22. In some embodiments, another ILD layer is formed with an upper metallization pattern over the top electrode.

Reference is then made to FIG. 13, which is a cross-sectional view of the MRAM device 100 after performing the operation 22. Another ILD layer 220 is formed over the substrate 110, and an upper metallization pattern 230 is then formed in the ILD layer 220. Formation of the upper metallization pattern 230 may be formed by etching an opening in the ILD layer 220, and then filling one or more metals in the opening to form the upper metallization pattern 230, so that the upper metallization pattern 230 can reach on the top electrode 160". In some embodiments, the opening and the metallization pattern may be formed by a dual-damascene process. Trenches and via openings are formed through the ILD layer 220, and then filled with a conductive material (e.g., copper). A planarization is then performed.

In some embodiments, the ILD layer 220 may have the same material as the ILD layer 112. In some other embodiments, the ILD layer 220 may have a different material than the ILD layer 112. In some embodiments, the ILD layer 220 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

In some embodiments, the bottom electrode layer 140' is patterned as a bottom electrode 140" using suitable etch techniques. As illustrated in FIG. 13, the bottom electrode 140" remains under the second spacer 210' and the MTJ stack 150". The bottom electrode 140" has a stepped top surface. A higher portion of the stepped top surface is in contact with the MTJ stack 150". A lower portion of the stepped top surface, which is in a position lower than the higher portion of the stepped top surface, is in contact with the bottom surface of the second spacer 210'.

Figure 14:
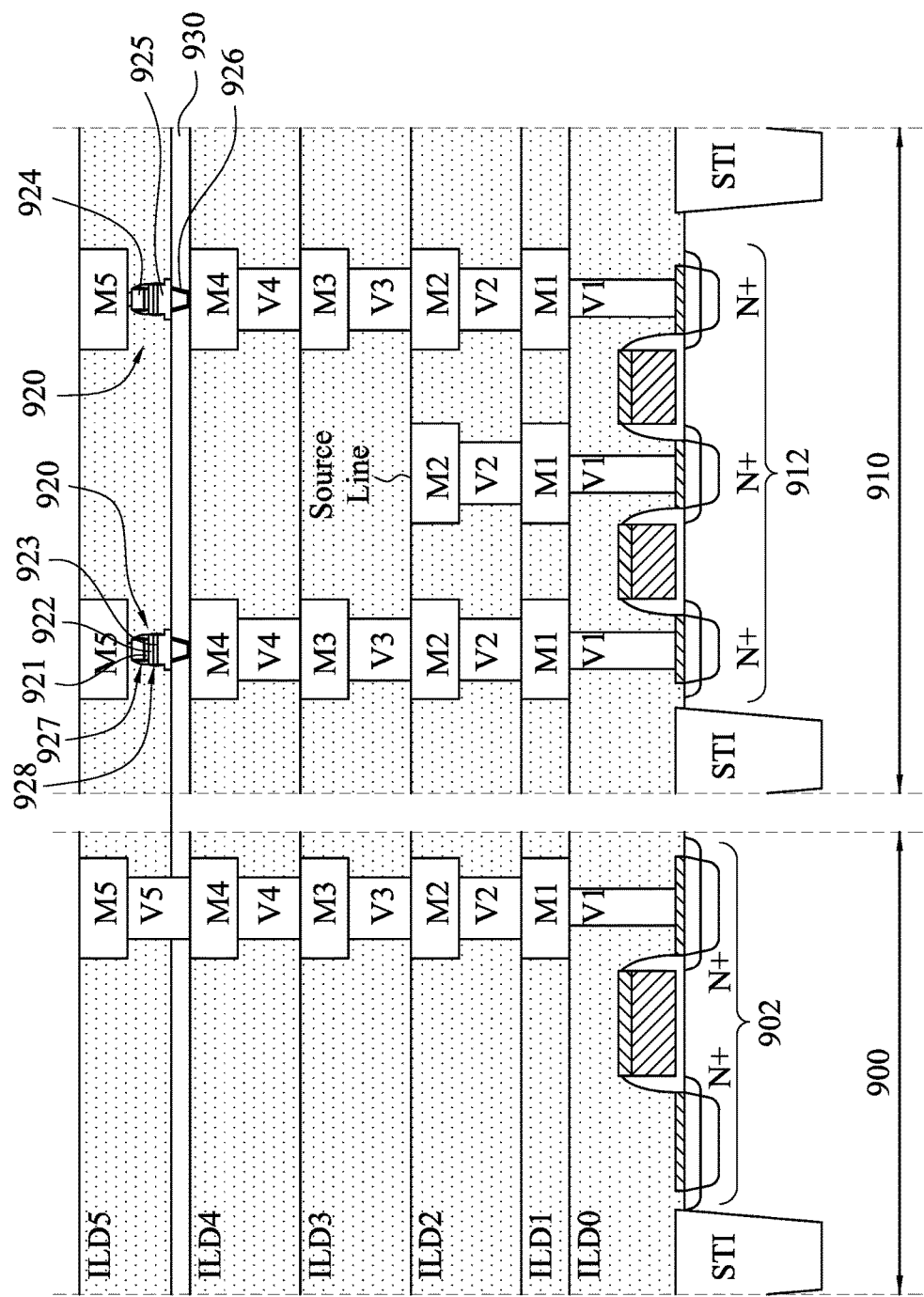
FIG. 14 illustrates an integrated circuit including MRAM devices and logic devices.

FIG. 14 illustrates an integrated circuit including MRAM devices and logic devices. The integrated circuit includes a logic region 900 and a MRAM region 910. Logic region 900 may include circuitry, such as the exemplary transistor 902, for processing information received from MRAM devices 920 in the MRAM region 910 and for controlling reading and writing functions of MRAM devices 920. In some embodiments, the MRAM device 920 includes an MTJ stack having a top magnetic layer 921, a bottom magnetic layer 923 and a tunnel barrier layer 922 between the top and bottom magnetic layers 921 and 923. The MRAM device 920 further includes a top electrode 924 over the MTJ stack, a bottom electrode 925 under the MTJ stack, and a BEVA 926 under the bottom electrode 925 and in the dielectric layer 930. The MRAM device 920 includes a metal residue 927 in contact with sidewalls of the top electrode 924 and of the top magnetic layer 921. The MRAM device 920 further includes a metal residue 928 in contact with sidewalls of the tunnel barrier layer 922, of the bottom magnetic layer 923 and of the bottom electrode 925. The metal residues 927 and 928 are separated from each other, such that an unwanted electrical connection between the top and bottom magnetic layers 921 and 923 can be prevented.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of logic transistor 902. The MRAM region 910 includes a full metallization stack connecting MRAM devices 920 to transistors 912 in the MRAM region 910, and a partial metallization stack connecting a source line to transistors 912 in the MRAM region 910. MRAM devices 920 are depicted as being fabricated in between the top of the M4 layer and the bottom the M5 layer. Also included in integrated circuit is a plurality of ILD layers. Six ILD layers, identified as ILD0 through ILD5 are depicted in FIG. 14 as spanning the logic region 900 and the MRAM region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that an unwanted electrical connection between the top and bottom magnetic layers caused by metal residues generated from the MTJ etching process can be prevented. Another advantage is that an additional cleaning process for removing the metal residues can be omitted.

In some embodiments, a memory device includes an MTJ structure and a first metal residue. The MTJ structure includes a top surface having a first width, a bottom surface having a second width greater than the first width, and a stepped sidewall structure between the top surface and the bottom surface. The stepped sidewall structure includes a first sidewall, a second sidewall, and an intermediary surface connecting the first sidewall to the second sidewall. The first metal residue is in contact with the first sidewall and not in contact with the second sidewall.

In some embodiments, the first metal residue includes a material substantially the same as the first sidewall.

In some embodiments, the first metal residue comprises a material different from the second sidewall.

In some embodiments, the memory device further includes a top electrode over the MTJ structure, and the first metal residue includes a material substantially the same as the top electrode.

In some embodiments, the first metal residue is further in contact with the top electrode.

In some embodiments, the memory device further includes a bottom electrode under the MTJ structure, and the first metal residue includes a material substantially the same as the bottom electrode.

In some embodiments, the first metal residue is further in contact with the bottom electrode.

In some embodiments, the memory device further includes a second metal residue in contact with the second sidewall and separated from the first metal residue.

In some embodiments, the second metal residue is not in contact with the first sidewall.

In some embodiments, the first metal residue and the second metal residue comprise different materials.

In some embodiments, the intermediary surface is a top surface of a tunnel barrier layer of the MTJ structure.

In some embodiments, at least a portion of the top surface of the tunnel barrier layer is free from coverage of the first metal residue.

In some embodiments, a memory device includes a bottom electrode, an MTJ stack, a first metal residue and a top electrode. The MTJ stack is over the bottom electrode and includes a first magnetic layer, a second magnetic layer and a tunnel barrier layer between the first magnetic layer and the second magnetic layer. The first metal residue extends along a sidewall of the first magnetic layer and terminating prior to reaching the second magnetic layer. The top electrode is over the MTJ stack.

In some embodiments, the first metal residue further extends along a sidewall of the tunnel barrier layer.

In some embodiments, the memory device further includes a second metal residue extending along a sidewall of the second magnetic layer and terminating prior to reaching the first magnetic layer.

In some embodiments, the memory device further includes a spacer in contact with a top surface of the tunnel barrier layer.

In some embodiments, the first magnetic layer and the second magnetic layer have different widths.

In some embodiments, a method of forming an MTJ structure includes forming in sequence a bottom magnetic layer, a tunnel barrier layer and a top magnetic layer over a bottom electrode; performing a first etching process to the top magnetic layer to form a patterned top magnetic layer; forming a spacer around the patterned top magnetic layer, the spacer covering a portion of the tunnel barrier layer while exposing another portion of the tunnel barrier layer; and performing a second etching process to remove the exposed portion of the tunnel barrier layer and a portion of the bottom magnetic layer under the exposed portion of the tunnel barrier layer.

In some embodiments, the second etching process is performed such that the removed portion of the bottom magnetic layer is re-sputtered to a sidewall of the covered portion of the tunnel barrier layer.

In some embodiments, the tunnel barrier layer has higher etch resistance to the first etching process than that of the top magnetic layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a magnetic tunnel junction (MTJ) structure comprising a top surface having a first width, a bottom surface having a second width greater than the first width, and a stepped sidewall structure between the top surface and the bottom surface, wherein the stepped sidewall structure comprises a first sidewall, a second sidewall, and an intermediary surface connecting the first sidewall to the second sidewall;
   a top electrode over the MTJ structure; and
   a first metal residue in contact with the top electrode and the first sidewall and not in contact with the second sidewall.

2. The memory device of claim 1, wherein the first metal residue comprises a material substantially the same as the first sidewall.

3. The memory device of claim 1, wherein the first metal residue comprises a material different from the second sidewall.

4. The memory device of claim 1, wherein the first metal residue comprising a material substantially the same as the top electrode.

5. The memory device of claim 1, further comprising:
   a bottom electrode under the MTJ structure, the first metal residue comprising a material substantially the same as the bottom electrode.

6. The memory device of claim 5, wherein the first metal residue is further in contact with the bottom electrode.

7. The memory device of claim 1, further comprising:
a second metal residue in contact with the second sidewall and separated from the first metal residue.

8. The memory device of claim 7, wherein the second metal residue is not in contact with the first sidewall.

9. The memory device of claim 7, wherein the first metal residue and the second metal residue comprise different materials.

10. The memory device of claim 1, wherein the intermediary surface is a top surface of a tunnel barrier layer of the MTJ structure.

11. The memory device of claim 10, wherein at least a portion of the top surface of the tunnel barrier layer is free from coverage of the first metal residue.

12. A memory device, comprising:
a bottom electrode;
a magnetic tunnel junction (MTJ) stack over the bottom electrode, the MTJ stack comprising a first magnetic layer, a second magnetic layer and a tunnel barrier layer between the first magnetic layer and the second magnetic layer;
a first metal residue extending along a sidewall of the first magnetic layer and a sidewall of the tunnel barrier layer, and terminating prior to reaching the second magnetic layer, wherein the first metal residue is in contact with the bottom electrode; and
a top electrode over the MTJ stack.

13. The memory device of claim 12, further comprising:
a second metal residue extending along a sidewall of the second magnetic layer and terminating prior to reaching the first magnetic layer.

14. The memory device of claim 13, wherein the first metal residue and the second metal residue have different materials.

15. The memory device of claim 12, further comprising:
a spacer in contact with a top surface of the tunnel barrier layer.

16. The memory device of claim 12, wherein the first magnetic layer and the second magnetic layer have different widths.

17. A memory device, comprising:
a magnetic tunnel junction (MTJ) structure comprising a bottom magnetic layer, a top magnetic layer and a tunnel barrier layer between the bottom magnetic layer and the top magnetic layer;
a first metal residue extending along a sidewall of the tunnel barrier layer; and
a second metal residue extending along a sidewall of the top magnetic layer, wherein the first metal residue is separated from the second metal residue, and the second metal residue has a portion above a top surface of the top magnetic layer.

18. The memory device of claim 17, wherein the first metal residue and the second metal residue have different materials.

19. The memory device of claim 17, wherein the first metal residue further extends along a sidewall of the bottom magnetic layer.

20. The memory device of claim 17, further comprising a top electrode over the MTJ structure and in contact with the second metal residue.

* * * * *